United States Patent [19]
Hofmann

[11] Patent Number: 6,163,232
[45] Date of Patent: Dec. 19, 2000

[54] FREQUENCY/PHASE MODULATOR USING A DIGITAL SYNTHESIS CIRCUIT IN A PHASE LOCKED LOOP

[75] Inventor: Ludwig Hofmann, Ilmmuenster, Germany

[73] Assignee: Siemens Aktiengesellschaft, Munich, Germany

[21] Appl. No.: 09/524,234

[22] Filed: Mar. 13, 2000

Related U.S. Application Data

[63] Continuation of application No. PCT/DE98/02437, Aug. 20, 1998.

[51] Int. Cl.[7] .................................. H03C 3/09; H03L 7/18
[52] U.S. Cl. .......................... 332/127; 332/144; 455/110
[58] Field of Search .................................... 332/100, 103, 332/127, 144; 375/271, 272, 279, 302, 303, 308; 455/42, 110, 113

[56] References Cited

U.S. PATENT DOCUMENTS

| | | | |
|---|---|---|---|
| 5,353,311 | 10/1994 | Hirata et al. ............................. | 375/135 |
| 5,497,399 | 3/1996 | Ito ........................................... | 332/126 |

FOREIGN PATENT DOCUMENTS

| | | | |
|---|---|---|---|
| 0 527 660 A1 | 2/1993 | European Pat. Off. . | |
| 43 20 087 C1 | 8/1994 | Germany . | |
| 39 08 243 C2 | 1/1997 | Germany . | |

*Primary Examiner*—Siegfried H. Grimm
*Attorney, Agent, or Firm*—Herbert L. Lerner; Laurence A. Greenberg; Werner H. Stemer

[57] ABSTRACT

A circuit for generating a modulated signal contains a reference oscillator for generating a reference signal, a digital synthesis circuit having a clock input and an addition value input for generating a synthesis signal, and a phase comparator for generating a tuning signal depending on the result of a comparison of the phase of the reference signal with the phase of the synthesis signal. An oscillator is provided, which is controlled in a manner dependent on the tuning signal and serves for generating the modulated signal and a further oscillator signal, from which a clock signal present at the clock input of the digital synthesis circuit can be derived. The circuit has a drive device, which generates a digital drive signal from carrier frequency and modulation signals. The drive signal being present at the addition value input of the digital synthesis circuit. A circuit of this type provides a modulated signal having a high phase and frequency accuracy, has a low outlay on components and is readily integrable.

17 Claims, 2 Drawing Sheets

FREQUENCY/PHASE MODULATOR USING A DIGITAL SYNTHESIS CIRCUIT IN A PHASE LOCKED LOOP

CROSS-REFERENCE TO RELATED-APPLICATION

This is a continuation of copending International Application PCT/DE98/02437, filed Aug. 20, 1998, which designated the United States.

BACKGROUND OF THE INVENTION

Field of the Invention

The invention relates to a circuit for generating a modulated signal. In particular, the invention is intended for generating a frequency-modulated and/or phase-modulated radio frequency signal, as is required for example in radio transmission apparatuses, cordless telephones, mobile telephones and other modulating data transmission devices.

The use of quadrature modulators for generating frequency-modulated or phase-modulated signals is known, the modulators either operate at the transmission frequency or use intermediate frequency modulation with subsequent conversion to the transmission frequency. Such quadrature modulators can be used to generate frequency-modulated or phase-modulated signals having high frequency or phase accuracy. Such high requirements of accuracy are demanded for example in the Gauss minimum shift keying (GSMK) modulation method used in the GSM standard, or in the differential phase shift keying (DPSK) modulation method.

However, circuits having quadrature modulators are complicated both in the digital section and—principally—in the analog section, demand components with close tolerances, and are poorly integrable.

German Patent DE 43 20 087 C1 discloses a control generator with a phase locked loop. A possible refinement that is specified is that the generator can be both frequency-modulated and phase-modulated digitally by way of suitable control words being input. More extensive details in connection with the features provided for modulation are not disclosed, however.

SUMMARY OF THE INVENTION

It is accordingly an object of the invention to provide a circuit for generating a modulated signal which overcomes the above-mentioned disadvantages of the prior art devices of this general type, which has high phase and frequency accuracy and has a low outlay on components and, in particular, is readily integrable and can obtain a high modulation quality.

With the foregoing and other objects in view there is provided, in accordance with the invention, a circuit for generating a modulated signal, including a frequency-modulated signal, a phase-modulated signal and a phase/frequency modulated signal, the circuit including:

a reference oscillator for generating a reference signal having a phase;

a digital synthesis circuit having a clock input and an addition value input, the digital synthesis circuit generating a synthesis signal having a phase;

a phase comparator receiving the reference signal and the synthesis signal, the phase comparator generating a tuning signal depending on a result of a comparison of the phase of the reference signal with the phase of the synthesis signal;

an oscillator controlled in a manner dependent on the tuning signal and serves for generating the modulated signal and an oscillator signal, from the oscillator signal a clock signal present at the clock input of the digital synthesis circuit can be derived;

a drive device for generating a digital drive signal from a carrier frequency signal and a modulation signal received by the drive device, the digital drive signal being present at the addition value input of the digital synthesis circuit; and a conditioning device for generating the modulation signal depending on an input signal received by the conditioning device, the conditioning device having at least one of a sampling circuit, an oversampling circuit, a filter device and a waveform shaping device.

The invention is based on the fundamental idea of using a reciprocal digital synthesis device for generating the modulated output signal. In the reciprocal digital synthesis device, a controlled oscillator is tied to a reference oscillator with the aid of a digital synthesis circuit (also referred to as DDS circuit, where DDS stands for "direct digital synthesizing") known per se. The controlled oscillator is pulled by a phase comparison circuit.

The circuit for generating the modulated signal has high accuracy and spectral purity of the output signal. Despite the high quality, only a relatively low outlay on components is necessary, and the circuit is readily integrable owing to the high digital proportion. The output signal can be modulated in very small tuning steps. Good and accurate phase modulation is also possible by virtue of the fact that the frequency of the output signal can be set extremely precisely.

In the case of the circuit according to the invention, a drive device is provided, which generates a digital drive signal for the digital synthesis circuit from preferably digital carrier frequency and modulation signals. In the sense in which it is used here, a digital signal is understood to be any signal or signal burst from which digital values can be derived. In particular, a digital signal may therefore have a plurality of partial signals that are transmitted on a respective line of a parallel data transmission path. Each partial signal then defines a bit of a digital data word at each instant.

In preferred embodiments, the drive device contains an adder, which generates the drive signal by addition of the carrier frequency and modulation signals. In this case, the aforementioned signals preferably each define at least one digital data word or a sequence of digital data words. In preferred embodiments, the carrier frequency signal specifies the carrier frequency for the modulated output signal, while the modulation signal preferably defines a sequence of signed digital data words which determine a deviation of the modulated output signal from the carrier frequency.

The carrier frequency and modulation signals are each preferably a burst of digital partial signals that are transmitted in parallel and are stored in two latches of the drive device for inputting into the adder.

In order to obtain a good modulation quality, a conditioning device is provided according to the invention, which converts a digital or analog input signal into a suitable, digital modulation signal. If the input signal is analog, the conditioning device preferably has a sampling circuit for digitizing the input signal. Since a high updating rate for the modulation signal is necessary in order to achieve a high modulation quality, the circuit implements, in accordance with a first aspect of the invention, oversampling and/or filtering and/or waveform shaping of the sampled values of an analog input signal or of the data values of a digital input signal._

If, in preferred embodiments, the modulation information items, as a signed digital data word, are added to the carrier frequency information items, the relative influence of a change in the modulation information items per unit is dependent on the respective carrier frequency. Therefore, in accordance with a second aspect of the invention, an adapting device is preferably provided in the conditioning device, which scales the modulation information items depending on the present carrier frequency. The adapting device may have a multiplication unit or, in simple systems, a scaling table. Furthermore, a frequency grouping device may be provided in order to form groups of adjacent carrier frequencies, with the result that less storage space is required in the scaling table.

In preferred embodiments, the clock signal of the digital synthesis circuit is derived from an oscillator signal of the controlled oscillator by a frequency divider. The digital synthesis circuit is then operated with a clock signal much lower than the output signal, as a result of which the current consumption of the digital synthesis circuit and the requirements imposed on it are reduced.

The controlled oscillator is preferably a voltage-controlled oscillator, which may be constructed for example using variable capacitance diodes.

Other features which are considered as characteristic for the invention are set forth in the appended claims.

Although the invention is illustrated and described herein as embodied in a circuit for generating a modulated signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
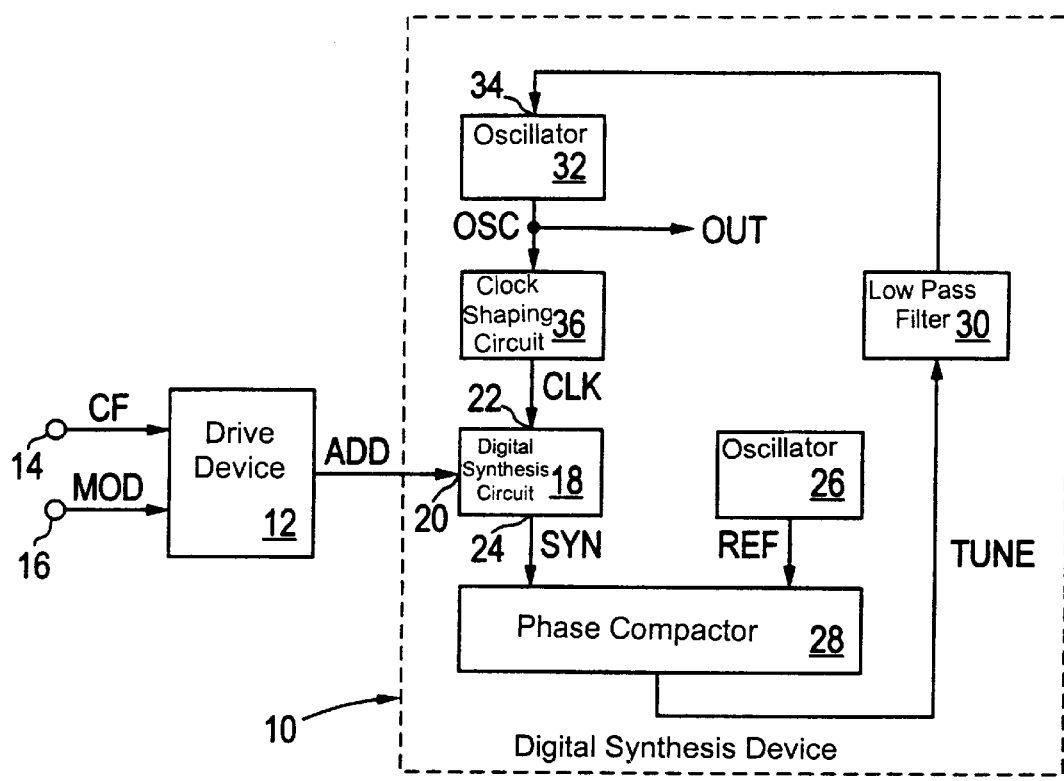
FIG. 1 is a block diagram of an exemplary embodiment of a circuit according to the invention.

In all the figures of the drawing, sub-features and integral parts that correspond to one another bear the same reference symbol in each case. Referring now to the figures of the drawings in detail and first, particularly, to FIG. 1 thereof, there is shown a circuit for generating a modulated signal OUT, designated as an output signal below. A reciprocal digital synthesis device 10 is supplied with a digital drive signal ADD by a drive device 12. For its part, the drive device 12 has an input 14 for a carrier frequency signal CF and an input 16 for a modulation signal MOD. Each of the signals ADD, CF and MOD is formed from a burst of partial signals that each correspond to a data bit and are transmitted on parallel lines.

The reciprocal digital synthesis device 10 has, as an important component, a digital synthesis circuit 18 known per se, the functioning of which will be described in more detail below. The digital synthesis circuit 18, which is also referred to as DDS circuit (DDS=direct digital synthesizing), is contained for example in the module from Analog Devices which is marketed under the type designation AD7008. The digital drive signal ADD from the drive device 12 is present at an addition value input 20 of the digital synthesis circuit 18. Furthermore, the digital synthesis circuit 18 has a clock input 22 and an output 24 for a synthesis signal SYN.

A reference oscillator 26 is configured as a crystal oscillator and outputs a reference signal REF at a constant frequency. The reference signal REF and the synthesis signal SYN are present at inputs of a phase comparator 28. The phase comparator 28 compares phase angles of the two signals SYN and REF and generates an analog tuning signal TUNE, which reproduces the result of the comparison. The tuning signal TUNE of the phase comparator 28 is present, via a low-pass filter 30, at a control input 34 of a voltage-controlled oscillator 32.

The voltage-controlled oscillator 32 generates a sinusoidal oscillator signal OSC, which, on the one hand, serves as the modulated output signal OUT of the entire circuit and, on the other hand, is fed to the clock shaping circuit 36. The output signal OUT may, for example, have a frequency of 900 MHz and be conducted directly to a transmission output stage of a mobile telephone.

The clock shaping circuit 36 is configured as a limiting amplifier and generates a square-wave clock signal CLK from the oscillator signal OSC, the clock signal being present at the clock input 22 of the digital synthesis circuit 18. In alternative embodiments, the oscillator signal OSC can be used directly as the clock signal CLK, the clock shaping circuit 36 thereby being obviated. This is possible particularly when the oscillator 32 generates a square-wave oscillator signal OSC. In further alternative embodiments, the oscillator 32 is constructed in such a way that it directly generates both the output signal OUT and the clock signal CLK, each with a different signal waveform but at the same frequency.

Overall, in the circuit according to FIG. 1, the voltage-controlled oscillator 32 is tracked like a phase locked loop (PLL) in such a way that the frequencies of the signals SYN and REF correspond. In this case, the digital synthesis circuit 18 acts as a finely adjustable frequency divider, where different, including fractional, frequency division factors can be set via the addition value input 20.

In further alternative embodiments of the circuit according to FIG. 1, the clock shaping circuit 36 has a frequency divider in order to derive the clock signal CLK for the digital synthesis circuit 18 from the oscillator signal OSC with a fixed division ratio. The frequency of the reference oscillator 26 is also lower by this division ratio. In these alternative embodiments, the digital synthesis circuit 18 need only be configured for lower clock frequencies, and it has a correspondingly lower current consumption.

Figure 2:
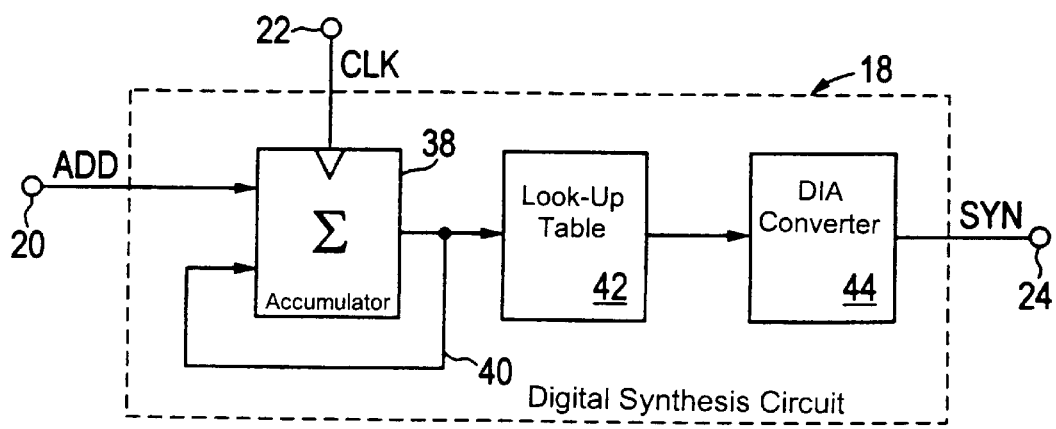
FIG. 2 is a block diagram of a digital synthesis circuit.

The digital synthesis circuit 18 contains, as is shown in FIG. 2, an accumulator 38, that is to say a storing summer. The accumulator 38 always outputs the present counter reading in each case. By a feedback connection 40, this value is fed to a first summation input of the accumulator 38. A second summation input of the accumulator 38 forms the addition value input 20 of the digital synthesis circuit 18, and a clock input of the accumulator 38 forms the clock input 22 of the digital synthesis circuit 18. Furthermore, a look-up table 42 is connected to the summation value output of the accumulator 38, and a digital/analog converter 44 generates the analog synthesis signal SYN at the output 24 depending on the outputs of the look-up table 42.

During operation, the accumulator 38 adds the addition value present at the addition value input 20 to the present counter reading in each case, in a clock cycle determined by the clock signal CLK. The addition range of the accumulator 38 is thus swept through cyclically, any overflows that occur not being taken into consideration. The frequency of the addition range sweeps is proportional to the clock frequency fCLK and the addition value present, and inversely proportional to the word width of the accumulator 38.

The look-up table 42 transforms the digital output values of the accumulator 38 into a desired, cyclic value progression sequence from which the analog synthesis signal SYN is generated by the digital/analog converter 44. By virtue of suitable occupancy of the look-up table 42, any periodic signal waveform of the synthesis signal SYN, generally a sinusoidal signal, can be generated from the outputs of the accumulator 38.

In a further alternative embodiment of the digital synthesis circuit 18, the look-up table 42 is omitted, and the digital/analog converter 44 receives the counter reading of the accumulator 38 directly as an input value. In this case, the synthesis signal SYN at the output 24 is a sawtooth-waveform signal. The signal waveform of the desired synthesis signal SYN depends on the properties of the phase comparator 28.

To summarize, the frequency $f_{SYN}$ of the synthesis signal SYN corresponds to the sweep frequency of the addition range of the accumulator 38. The following relationship, already indicated above, thus holds true:

$$f_{SYN} = \frac{f_{CLK} \cdot \text{Addition value}}{\text{Addition range}}$$

By changing the addition value it is possible to change the frequency of the synthesis signal SYN (and thus the frequency division factor of the digital synthesis circuit 18). The synthesis signal frequency $f_{SYN}$ can be changed over very rapidly and at any instant without a sudden phase change.

Figure 3:
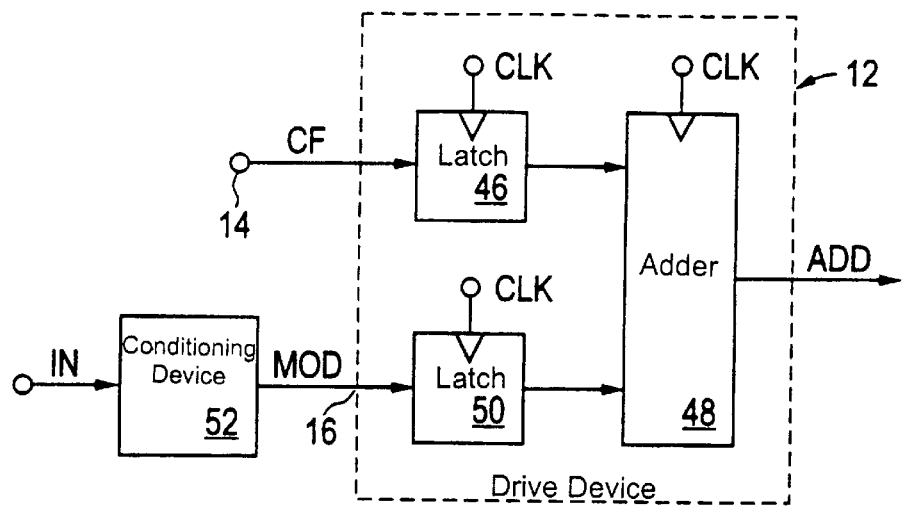
FIG. 3 is a block diagram of a drive device connected to a conditioning device.

FIG. 3 shows the more detailed structure of the drive device 12. The input 14 for the carrier frequency signal CF is connected to a first summation input of a clocked adder 48 via a clocked latch 46. The modulation signal MOD present at the input 16 is connected to a second summation input of the adder 48 via a further clocked latch 50. The output signal of the adder 48 is the digital drive signal ADD, which is present at the addition value input 20 of the digital synthesis circuit 18.

During operation of the drive device 12 illustrated in FIG. 3, the signals CF and MOD are held in the latches 46 and 50 and added by the adder 48. During each clock cycle, the latch 46 stores a digital data word which is determined by the carrier frequency signal CF and specifies the unmodulated fundamental frequency of the output signal OUT.

The carrier frequency signal CF is determined depending on the desired transmission/reception channel. In addition, fine tuning of the voltage-controlled oscillator 32 is effected by way of the carrier frequency signal CF, in order, for example, to compensate for a temperature-dependent shift in the frequency of the reference oscillator 26.

During each clock cycle, the latch 50 stores the present value of the conditioned modulation signal MOD as a digital data word. This value represents the modulation information and is interpreted as a signed binary number by the adder 48. By suitable variation of the modulation value defined by the signal MOD, the frequency of the voltage-controlled oscillator 32 can be varied very rapidly and accurately, with the result that frequency modulation is possible. Since the phase of the output signal OUT is determined by the integral of frequency changes in this signal, phase modulation of the output signal OUT can also be effected by use of momentary, targeted frequency changes.

In the exemplary embodiment that is described here, the adder 48 and the two latches 46 and 50 are clocked by the clock signal CLK derived from the oscillator signal OSC. In alternative embodiments, other clock frequencies may also be used. The updating rate for the modulation information must, however, always be considerably larger than the loop bandwidth of the phase locked loop in the reciprocal digital synthesis device 10. This loop bandwidth is determined by the cut-off frequency of the low-pass filter 30.

Furthermore, FIG. 3 shows a conditioning device 52, which generates the digital modulation signal MOD from an input signal IN. In the exemplary embodiment that is described here, the input signal IN is an analog signal which reproduces the information items that are to be modulated onto the carrier frequency.

Figure 4:
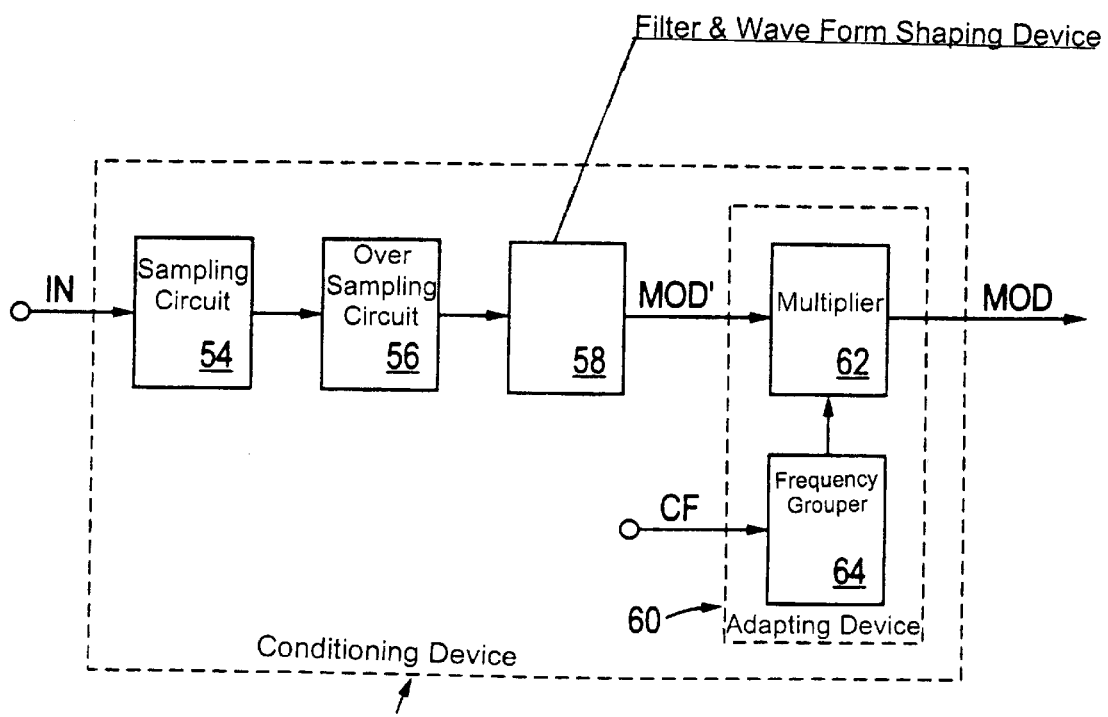
FIG. 4 is a block diagram of the conditioning device shown in FIG. 3.

The conditioning device 52 of the exemplary embodiment that is described here is shown in more detail in FIG. 4. The analog input signal IN is first fed to a sampling circuit 54, which is configured as an analog/digital converter here. In alternative embodiments in which the input signal IN is a digital signal, the sampling circuit 54 may be configured as a clocked latch or be entirely dispensed with.

For further conditioning of the modulation information items, an oversampling circuit 56 is provided, which inserts further sampling points between the discrete points of the input signal IN which are determined by the sampling circuit 54. The oversampling circuit 56 may operate by use of linear interpolation between two respective discrete points, or it may incorporate more than two adjacent discrete points and connect them together as smoothly as possible. In order to obtain a good modulation quality, it is desirable to choose the highest possible sampling and/or oversampling frequency, because the interfering frequency components in the output signal OUT increase, the coarser a possible staircase structure in the modulation signal MOD is.

In order to improve the modulation quality further, a filter and waveform shaping device 58 is furthermore provided, which generates, from the digital output signal of the oversampling circuit 56, an intermediate modulation signal MOD' which is smoothed further but still not scaled. In alternative embodiments, the input signal IN is not conditioned in such a complicated manner. By way of example, the oversampling circuit 56 or the filter and waveform shaping device 58 may be omitted if the respective other component already provides for sufficient signal smoothing. If the sampling circuit 54 already operates at a sufficiently high sampling frequency, it is also possible to dispense with both components 56 and 58.

Due to the structure of the reciprocal digital synthesis device 10, the modulation swing generated in the event of a change in the conditioned modulation signal MOD by one unit (one LSB–least significant bit) is dependent on the present carrier frequency. specifically, if the addition value signal ADD present at the addition value input 20 already defines a numerically high addition value, which is the case when the carrier frequency is high, the absolute change in the modulation signal MOD must be correspondingly higher in order to obtain a predetermined modulation swing (relative to the carrier frequency).

In order to compensate for this effect, the conditioning device 52 has an adapting device 60, which scales the filtered intermediate modulation signal MOD', generated by the filter and waveform shaping device 58 in accordance with the present carrier frequency or the present transmission/reception channel.

In order to effect this scaling, the adapting device 60 is provided with a multiplier 62, which multiplies the filtered intermediate modulation signal MOD' by a suitable scaling factor. The scaling factor is determined by a frequency grouper 64 depending on the present carrier frequency signal CF. The frequency grouper 64, which is configured as a look-up table, combines a plurality of adjacent channels, since the latter differ so little in terms of their carrier frequency that the swing deviation is of no consequence here. The number of channels that can be combined is dependent on the generated frequency, the swing and the channel width.

In alternative embodiments of the circuit shown in FIG. 4, the signal which serves as the input value of the frequency grouper 64 is not the carrier frequency signal CF but another suitable signal which specifies the present carrier frequency or the present transmission and reception channel. In further alternative embodiments, the frequency grouper 64 is dispensed with. A value determined by the present carrier frequency signal CF or the present addition value or a value derived from these values may then serve as a multiplicand of the multiplier 62. A look-up table or a scaling table may be used for determining the multiplicand.

In further alternative embodiments, the function of the frequency grouper 64 may be realized in a particularly simple manner by the least significant bit or a plurality of less significant bits of the present carrier frequency signal CF or of the present addition value being discarded.

In alternative embodiments which are suitable in particular for simpler systems, a look-up table is used instead of the multiplier 62, which look-up table outputs the modulation signal MOD depending on the signal value of the intermediate modulation signal MOD' and the frequency group determined by the frequency grouper 64. In this case, the storage space required for the look-up table is smaller, the more channels the frequency grouper 64 combines to form a respective frequency group. In this case, too, the function of the frequency grouper 64 can be simulated by the look-up table being fed only the more significant bits of the carrier frequency signal CF or of the present addition value.

I claim:

1. A circuit for generating a modulated signal, including a frequency-modulated signal, a phase-modulated signal and a phase/frequency modulated signal, the circuit comprising:
    a reference oscillator for generating a reference signal having a phase;
    a digital synthesis circuit having a clock input and an addition value input, said digital synthesis circuit generating a synthesis signal having a phase;
    a phase comparator receiving the reference signal and the synthesis signal, said phase comparator generating a tuning signal depending on a result of a comparison of the phase of the reference signal with the phase of the synthesis signal;
    an oscillator being controlled in a manner dependent on the tuning signal for generating the modulated signal and an oscillator signal, from the oscillator signal being derived a clock signal present at said clock input of said digital synthesis circuit;
    a drive device for generating a digital drive signal from a carrier frequency signal and a modulation signal received by said drive device, the digital drive signal being present at said addition value input of said digital synthesis circuit; and
    a conditioning device for generating the modulation signal depending on an input signal received by said conditioning device, said conditioning device having at least one of a sampling circuit, an oversampling circuit, a filter device and a waveform shaping device.

2. The circuit according to claim 1, wherein said conditioning device has an adapting device for adapting one of the input signal and a signal derived from the input signal to a respective carrier frequency with regard to a modulation swing.

3. The circuit according to claim 2, wherein said adapting device has at least one of a multiplier, a scaling table, and a frequency grouper.

4. The circuit according to claim 1, wherein said drive device has an adder with inputs for generating the digital drive signal by addition of the carrier frequency signal and the modulation signal.

5. The circuit according to claim 1, wherein said drive device has an adder for generating the digital drive signal by addition of signals derived from the carrier frequency signal and the modulation signal.

6. The circuit according to claim 4, wherein said drive device has two latches including a first latch for latching the carrier frequency signal and a second latch for latching the modulation signal, and said two latches are connected to said inputs of said adder.

7. The circuit according to claim 1, wherein the carrier frequency signal and the modulation signal are digital signals, and the carrier frequency signal, the modulation signal and the digital drive signal each define a stream of digital data words.

8. The circuit according to claim 1, including a clock shaping circuit having at least one of a limiting amplifier and a frequency divider, for deriving the clock signal from the oscillator signal.

9. The circuit according to claim 1, wherein the tuning signal is an analog voltage signal, and said oscillator controlled in a manner dependent on the tuning signal, is a voltage-controlled oscillator.

10. A circuit for generating a modulated signal, including a frequency-modulated signal, a phase-modulated signal and a phase/frequency modulated signal, the circuit comprising:
    a reference oscillator for generating a reference signal having a phase;
    a digital synthesis circuit having a clock input and an addition value input for generating a synthesis signal having a phase;
    a phase comparator for generating a tuning signal depending on a result of a comparison of the phase of the reference signal with the phase of the synthesis signal;
    an oscillator being controlled in a manner dependent on the tuning signal for generating the modulated signal and an oscillator signal, from the oscillator signal being derived a clock signal present at said clock input of said digital synthesis circuit;
    a drive device generating a digital drive signal from a carrier frequency signal and a modulation signal received by said drive device, the digital drive signal being present at said addition value input of said digital synthesis circuit; and
    a conditioning device for generating the modulation signal depending on an input signal received by said conditioning device, said conditioning device having an adapting device for adapting one of the input signal and a signal derived therefrom to a respective carrier frequency with regard to a modulation swing.

11. The circuit according to claim 10, wherein said adapting device has at least one of a multiplier, a scaling table, and a frequency grouper.

12. The circuit according to claim 10, wherein said drive device has an adder with inputs for generating the digital drive signal by addition of the carrier frequency signal and the modulation signal.

13. The circuit according to claim 10, wherein said drive device has an adder for generating the digital drive signal by addition of signals derived from the carrier frequency signal and the modulation signal.

14. The circuit according to claim 12, wherein said drive device has two latches including a first latch for latching the carrier frequency signal and a second latch for latching the modulation signal, and said two latches are connected to said inputs of said adder.

15. The circuit according to claim 10, wherein the carrier frequency signal and the modulation signal are digital signals, and the carrier frequency signal, the modulation signal and the digital drive signal each define a stream of digital data words.

16. The circuit according to claim 10, including a clock shaping circuit having at least one of a limiting amplifier and a frequency divider, for deriving the clock signal from the oscillator signal.

17. The circuit according to claim 10, wherein the tuning signal is an analog voltage signal, and said oscillator controlled in a manner dependent on the tuning signal, is a voltage-controlled oscillator.

* * * * *